(12) United States Patent
Shin et al.

(10) Patent No.: US 12,500,212 B2
(45) Date of Patent: Dec. 16, 2025

(54) SEMICONDUCTOR LIGHT-EMITTING ELEMENT SUPPLY DEVICE AND SUPPLY METHOD

(71) Applicant: LG ELECTRONICS INC., Seoul (KR)

(72) Inventors: Yongil Shin, Seoul (KR); Dohee Kim, Seoul (KR); Dohwan Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 745 days.

(21) Appl. No.: 17/783,731

(22) PCT Filed: Jan. 8, 2020

(86) PCT No.: PCT/KR2020/000305
§ 371 (c)(1),
(2) Date: Jun. 9, 2022

(87) PCT Pub. No.: WO2021/117974
PCT Pub. Date: Jun. 17, 2021

(65) Prior Publication Data
US 2023/0005888 A1    Jan. 5, 2023

(30) Foreign Application Priority Data
Dec. 13, 2019  (KR) ................. 10-2019-0167176

(51) Int. Cl.
*H01L 25/075* (2006.01)
*H01L 33/00* (2010.01)
*H10H 20/01* (2025.01)

(52) U.S. Cl.
CPC ......... *H01L 25/0753* (2013.01); *H10H 20/01* (2025.01)

(58) Field of Classification Search
None
See application file for complete search history.

(56) References Cited

U.S. PATENT DOCUMENTS 8,573,469 B2 * 11/2013 Hu .................. H01L 24/95
                                                      438/455
9,917,226 B1 *  3/2018 Heine ................ H10H 20/01
(Continued)

FOREIGN PATENT DOCUMENTS

CN    110088886 A    8/2019
EP    0 116 468 A1   8/1984
(Continued)

OTHER PUBLICATIONS

Written Opinion of the International Application from the International Application No. PCT/KR2020/000305 dated Sep. 11, 2020, 5 pages.*

*Primary Examiner* — Jethro M. Pence
(74) *Attorney, Agent, or Firm* — Birch, Stewart, Kolasch & Birch, LLP

(57) ABSTRACT

A semiconductor light-emitting element supply device according to an embodiment of the present invention supplies semiconductor light-emitting elements in a fluid chamber in which self-assembly occurs, the semdconductor light-emitting element supply device comprising: a tray disposed in the fluid chamber; a transfer unit which includes a magnet and a magnet accommodating part for accommodating the magnet and which transfers the semiconductor light-emitting elements by using magnetic force; a supply unit disposed above the tray to supply the transferred semiconductor light-emitting elements to the tray; and a control unit for controlling operations of the tray, the transfer unit and the supply unit, wherein the control unit controls the position of the magnet accommodated in the magnet accommodating part so that the semiconductor light-emitting elements are adhered on one surface of the magnet accommodating part or the adhered semiconductor light-emittng elements are (Continued)

separated from the one surface of the magnet accommodating part.

9 Claims, 15 Drawing Sheets

(56) References Cited

U.S. PATENT DOCUMENTS

| | | | | |
|---|---|---|---|---|
| 10,242,977 | B2* | 3/2019 | Sasaki | H10H 29/14 |
| 10,361,337 | B2* | 7/2019 | Ahmed | H01L 24/00 |
| 10,439,101 | B2* | 10/2019 | Ahmed | H10H 20/818 |
| 10,923,622 | B2* | 2/2021 | Ahmed | H10H 20/81 |
| 11,177,243 | B2* | 11/2021 | Ahmed | H01L 25/167 |
| 11,805,633 | B2* | 10/2023 | Jang | H05K 13/02 |
| 2018/0058080 | A1 | 3/2018 | Snyder et al. | |
| 2018/0102352 | A1 | 4/2018 | Sasaki et al. | |
| 2019/0058081 | A1* | 2/2019 | Ahmed | H10H 20/857 |
| 2019/0296184 | A1* | 9/2019 | Ahmed | H01L 24/00 |
| 2021/0136966 | A1* | 5/2021 | Jang | H05K 13/0482 |

FOREIGN PATENT DOCUMENTS

| | | |
|---|---|---|
| JP | 2010-45145 A | 2/2010 |
| KR | 10-2017-0113019 A | 10/2017 |
| KR | 10-2019-0018385 A | 2/2019 |
| KR | 10-2019-0122113 A | 10/2019 |
| KR | 10-2019-0127418 A | 11/2019 |

* cited by examiner

[FIG. 1]
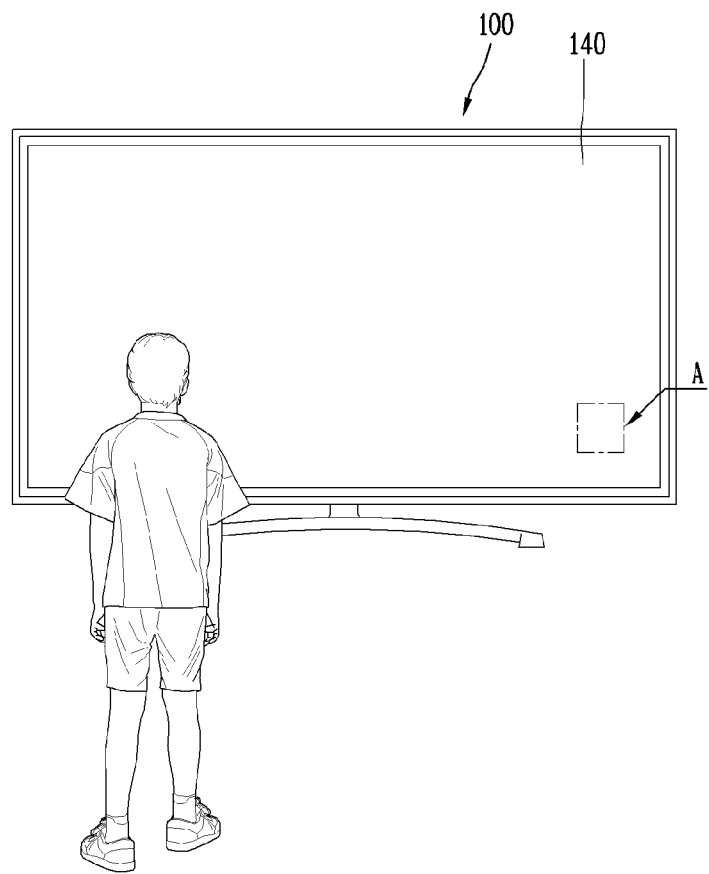

【FIG. 2】
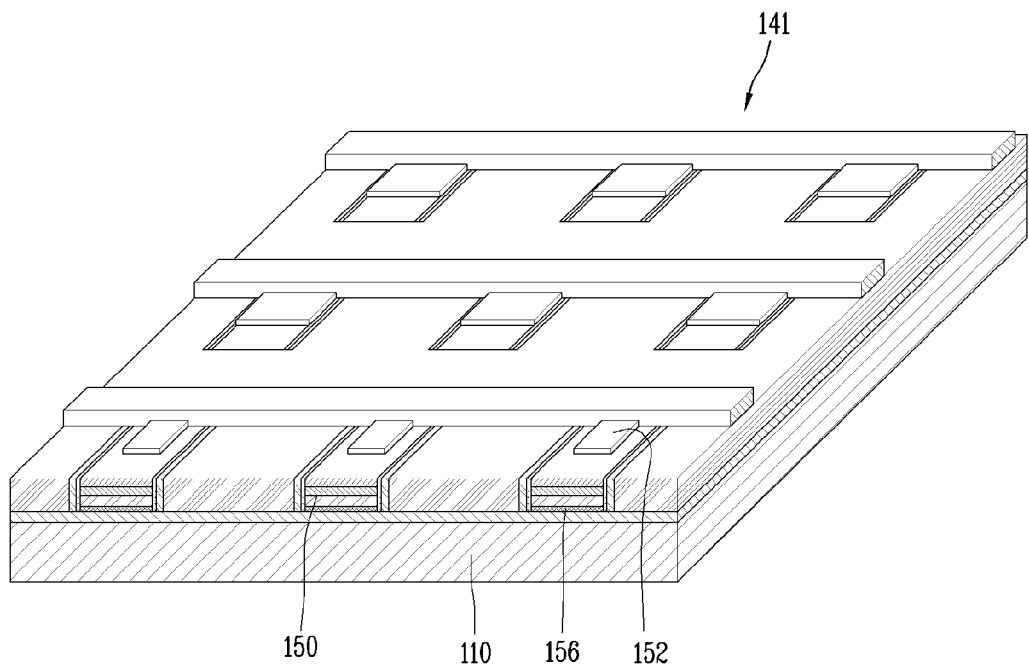

【FIG. 3】
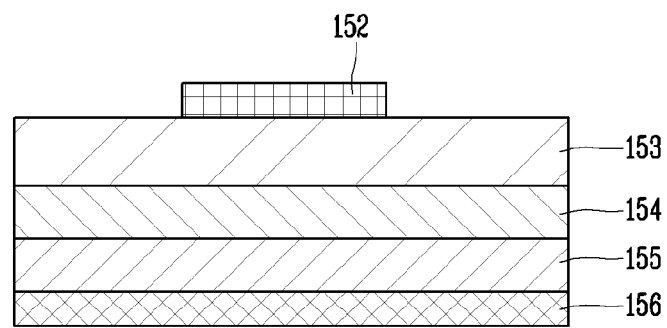
【FIG. 4】
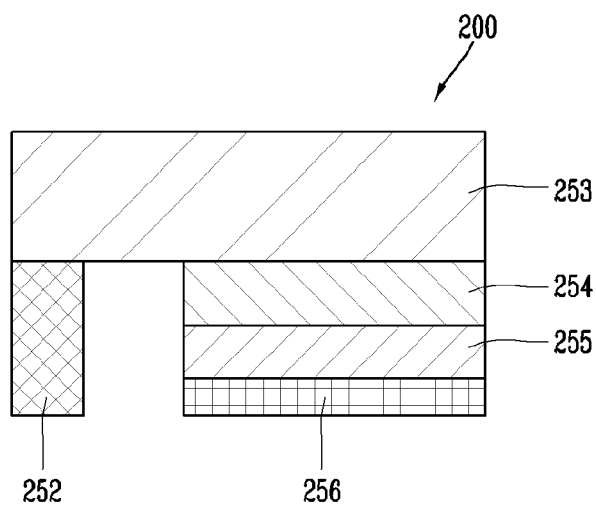

[FIG. 5a]
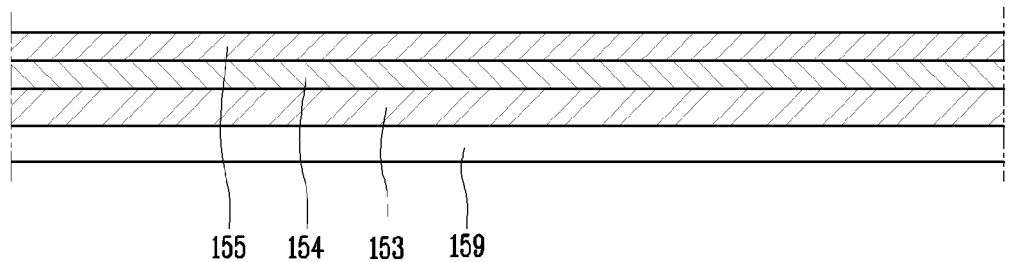
155 154 153 159
[FIG. 5b]
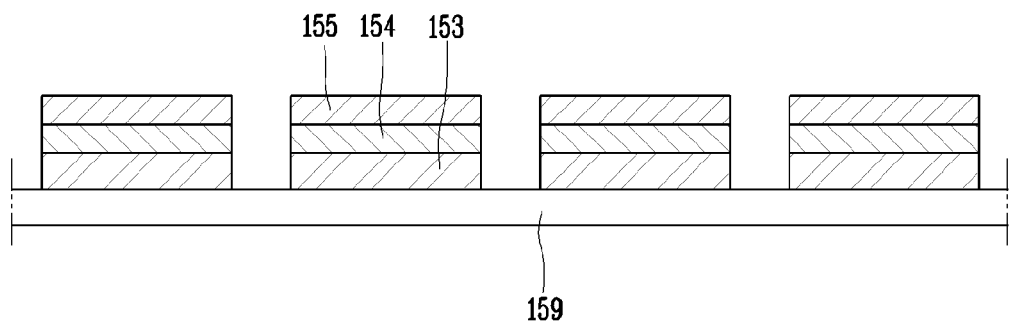
155 154 153
159
[FIG. 5c]
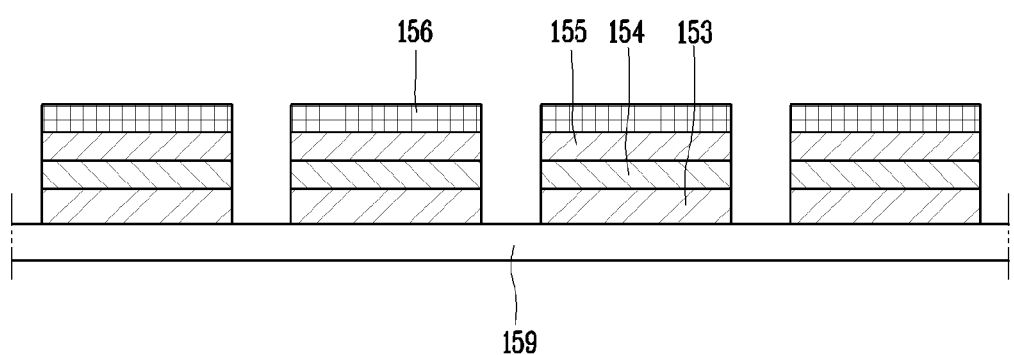
156  155 154 153
159

[FIG. 5d]
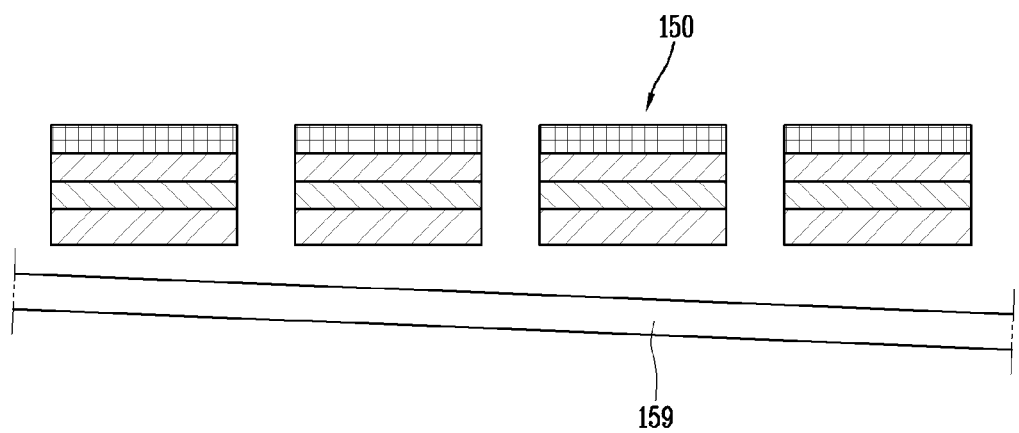
[FIG. 5e]
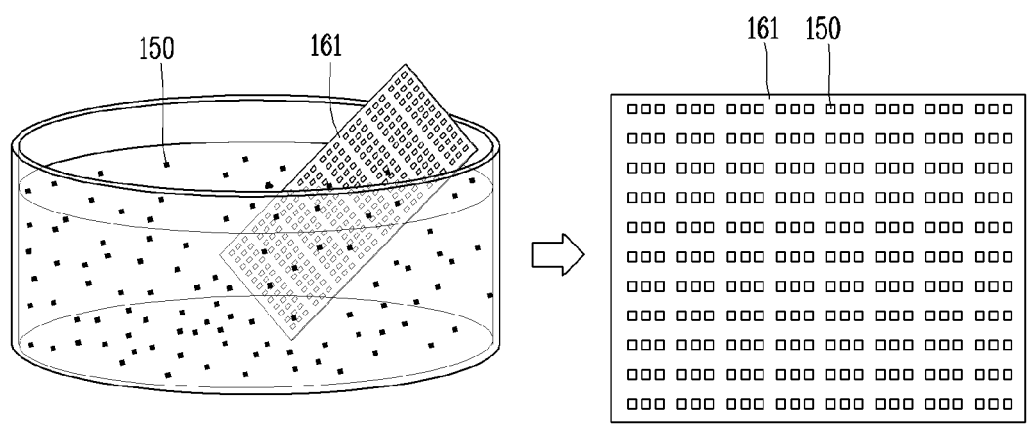

[FIG. 6]
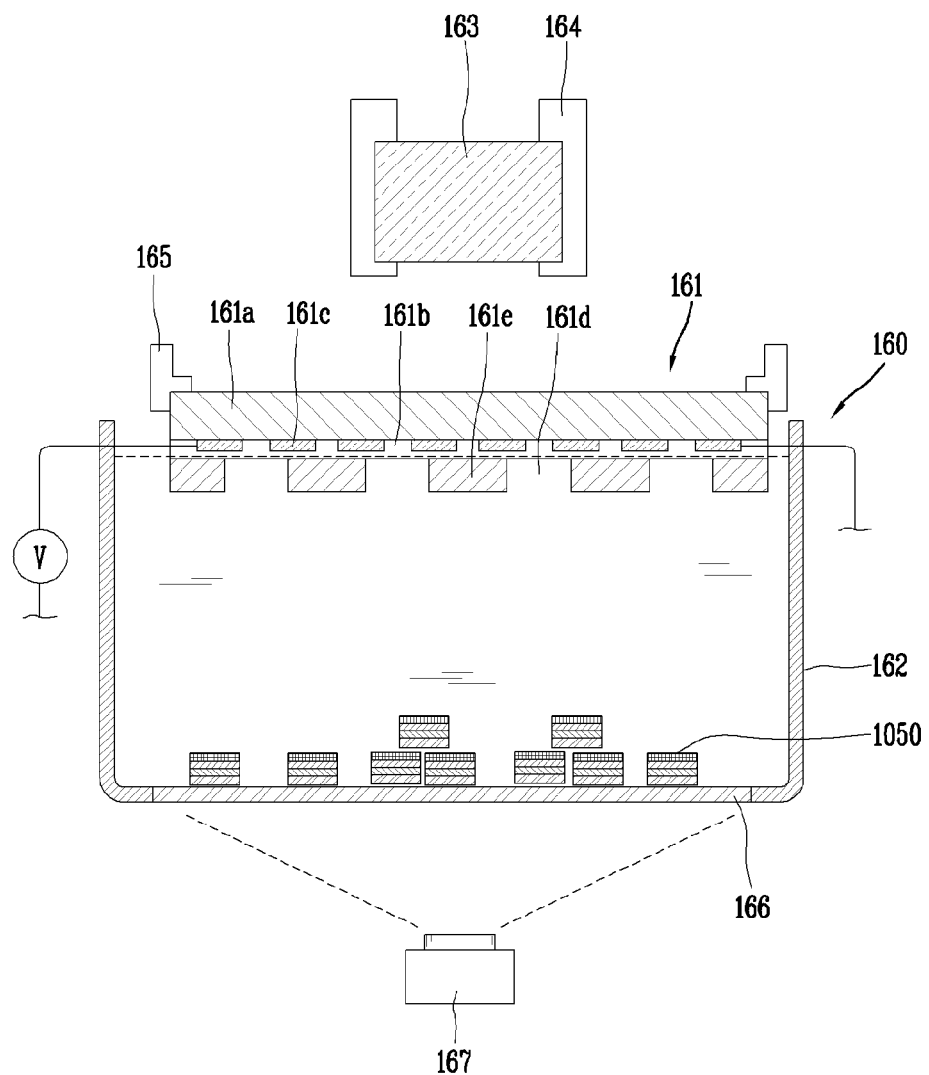

[FIG. 7]
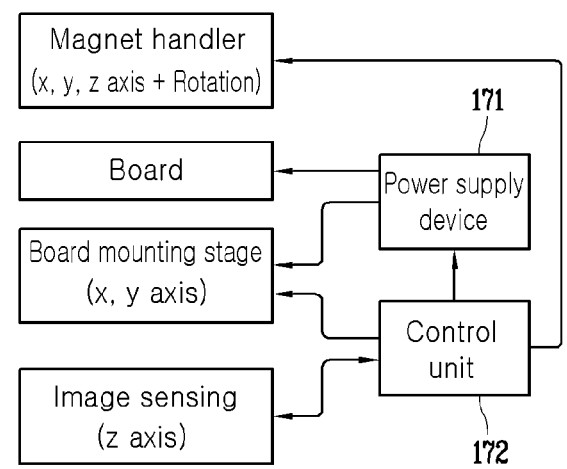

[FIG. 8a]
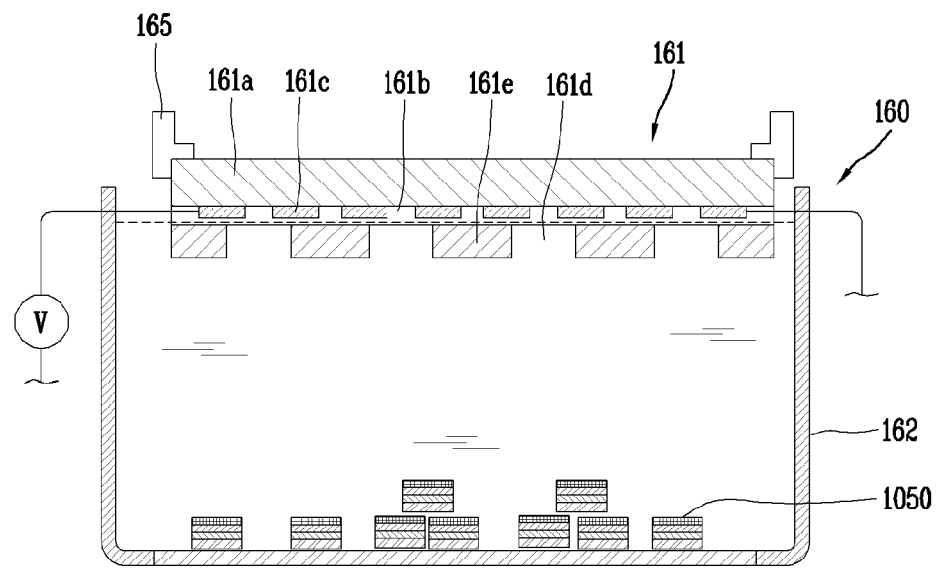
[FIG. 8b]
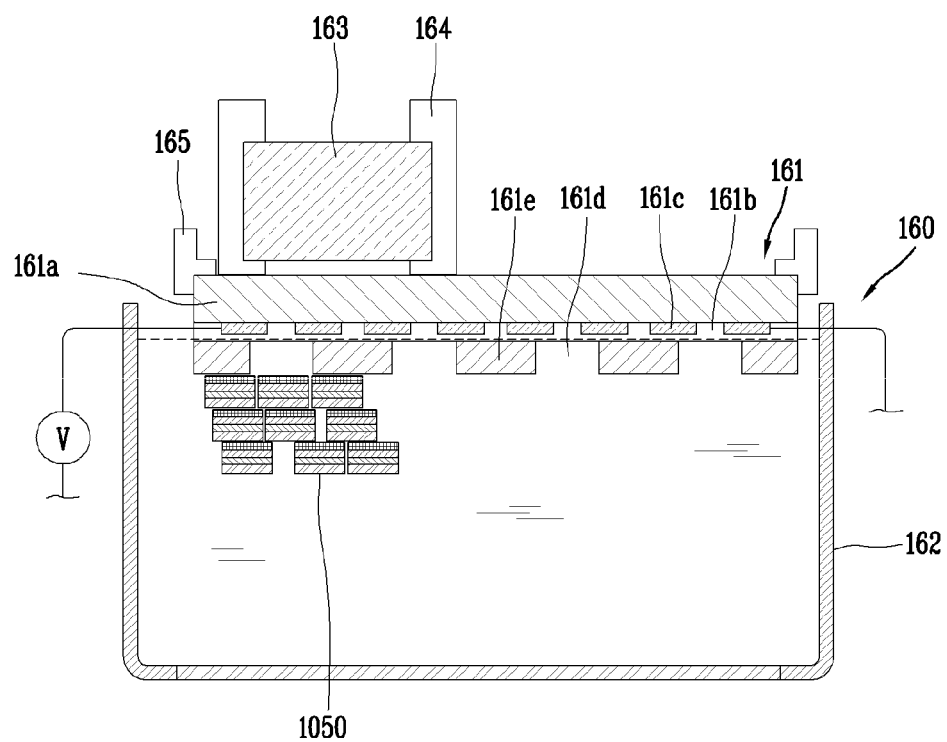

[FIG. 8c]
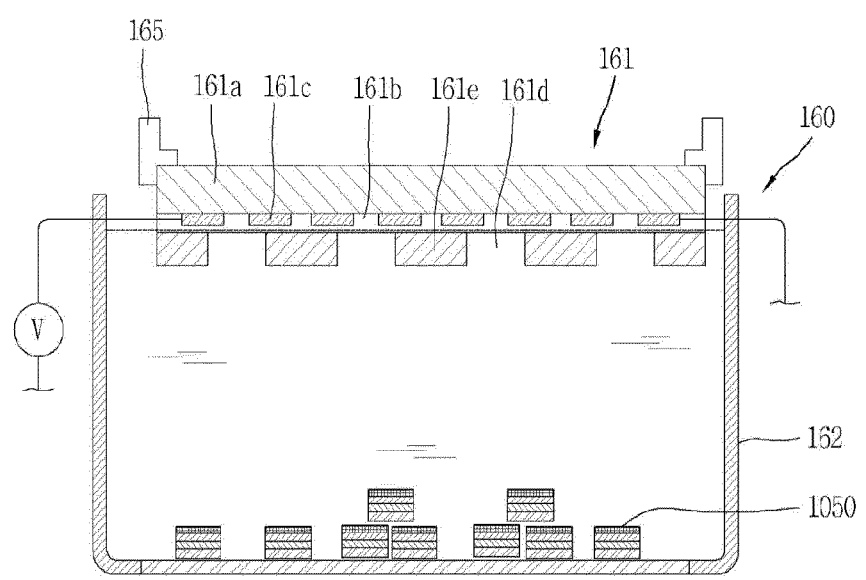

[FIG. 8d]
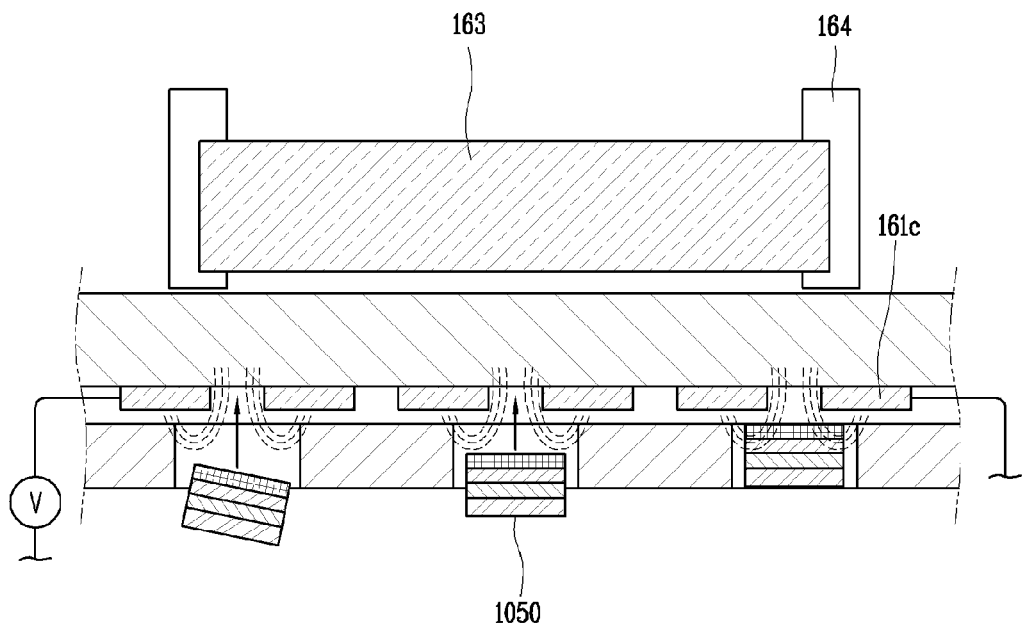
[FIG. 8e]
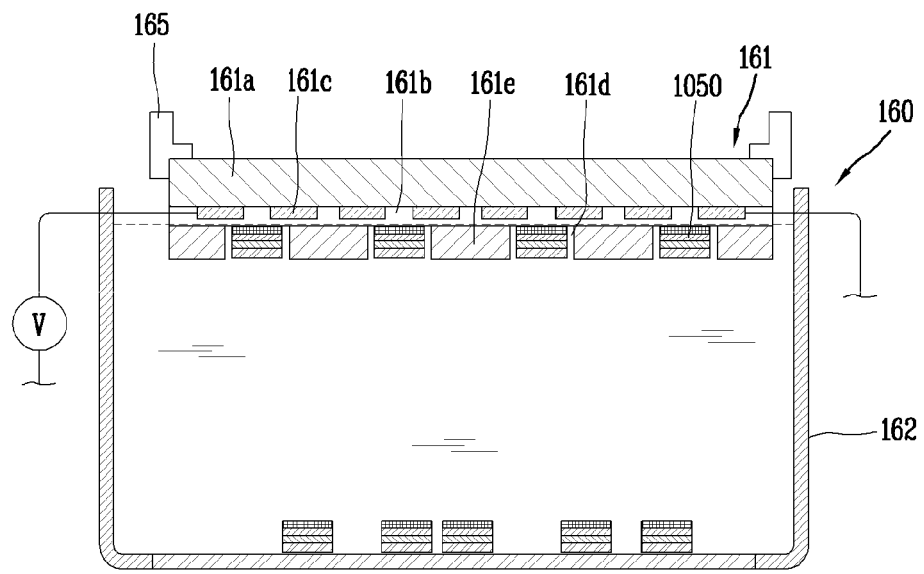

[FIG. 9]
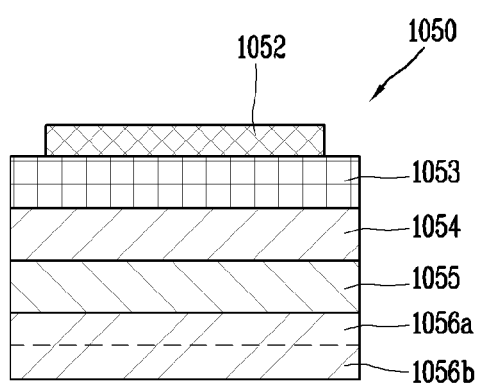

[FIG. 10]
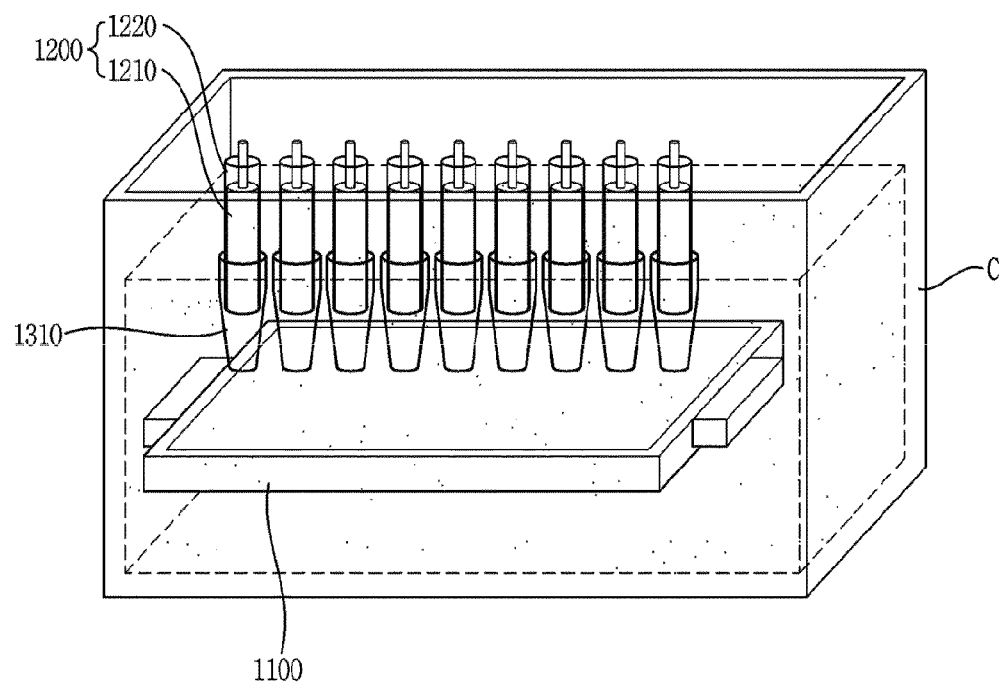
[FIG. 11]
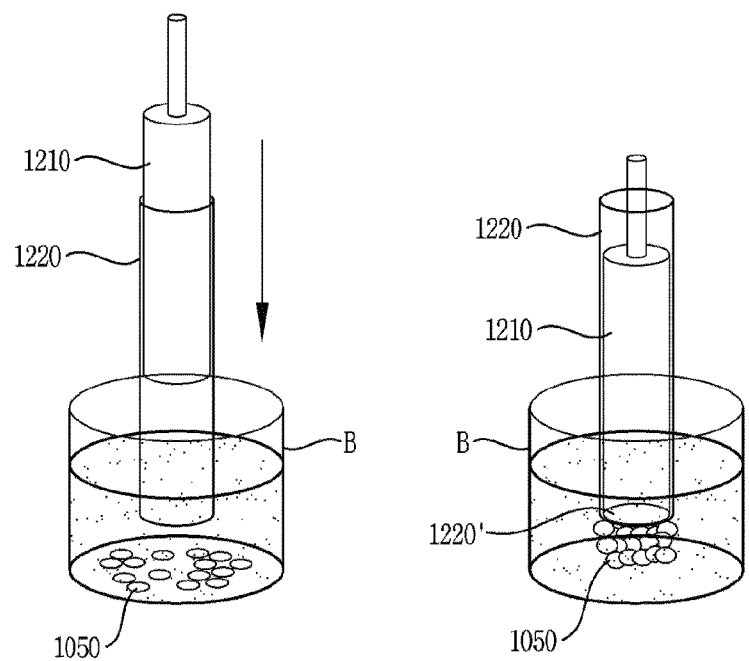

[FIG. 12]
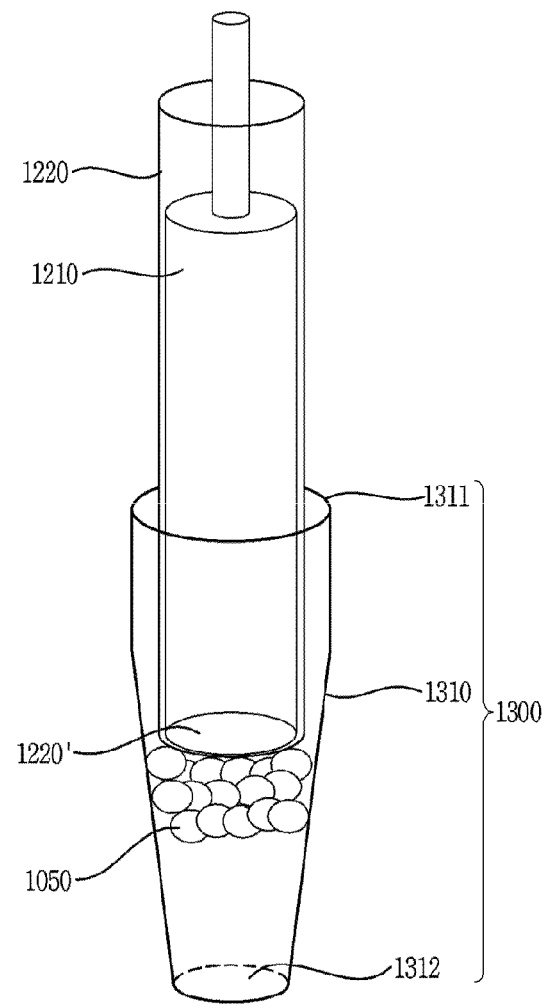

[FIG. 13]
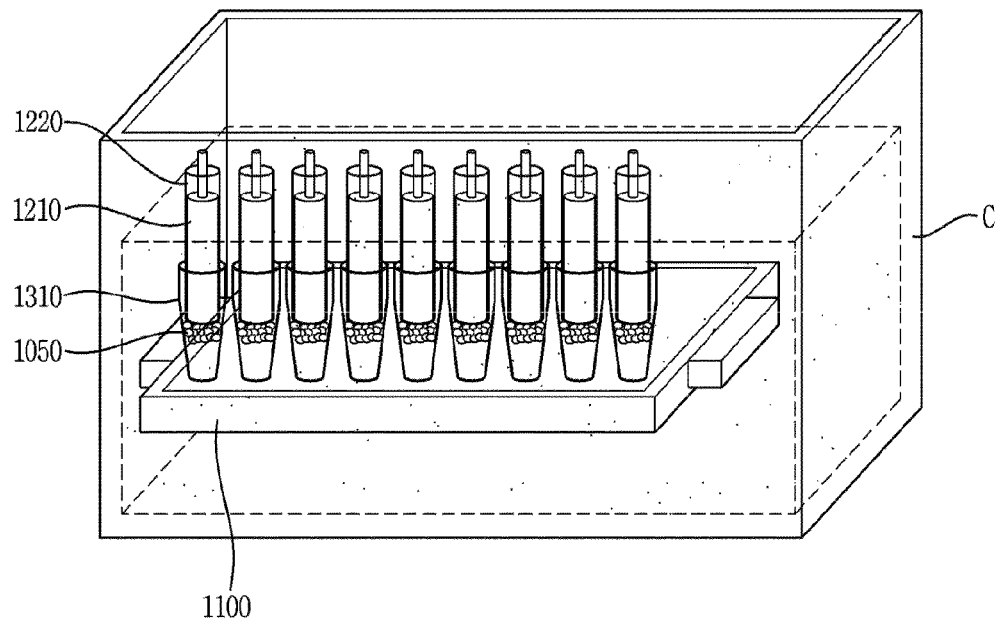
[FIG. 14]
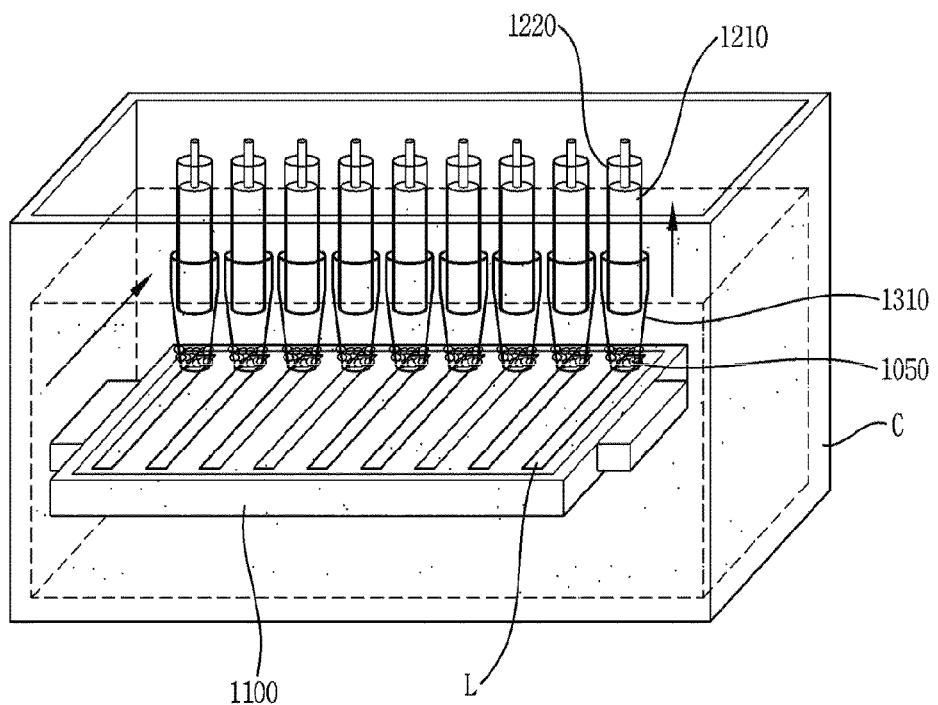

[FIG. 15]
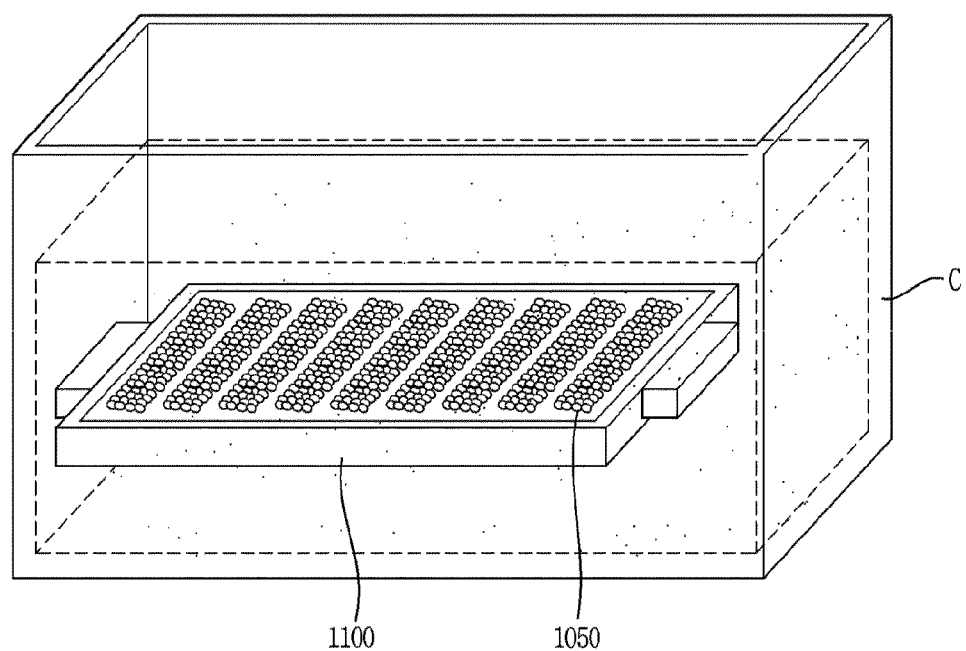

SEMICONDUCTOR LIGHT-EMITTING ELEMENT SUPPLY DEVICE AND SUPPLY METHOD

CROSS REFERENCE TO RELATED APPLICATIONS

This application is the National Stage filing under 35 U.S.C. 371 of International Application No. PCT/KR2020/000305, filed on Jan. 8, 2020, which claims the benefit of earlier filing date and right of priority to Korean Application No. 10-2019-0167176, filed on Dec. 13, 2019, the contents of all these applications are hereby incorporated by reference herein in their entirety.

TECHNICAL FIELD

The present disclosure relates to an apparatus for supplying a semiconductor light emitting diode having a size of several pm to several tens of pm, and a method for supplying a semiconductor light emitting diode using the same.

BACKGROUND ART

Recently, liquid crystal displays (LCD), organic light emitting diode (OLED) displays, and micro LED displays are competing to implement large-area displays in the display technology field.

However, in the LCD, reaction time is not rapid, and the light generated from the backlight represents a lower efficiency. In the OLED, lifespan is shorter, the production yield is not sufficient, and the efficiency is low.

On the other hand, when a semiconductor light emitting diode (micro LED (uLED)) having a diameter or cross-sectional area of 100 microns or less is used for a display, very high efficiency can be achieved because the display does not absorb light using a polarizing plate or the like. However, since a large display requires millions of semiconductor light emitting diodes, it is difficult to transfer the diodes compared to other technologies.

The technologies currently being developed for a transfer process may include pick & place technology, Laser Lift-off (LLO) technology, self-assembly technology or the like. Among them, the self-assembly technology is a method in which a semiconductor light emitting diode finds its own position in a fluid, and is the most advantageous method for realizing a large-screen display device.

Currently, semiconductor light emitting diodes have been manually supplied for each assembly line in the fluid to perform a self-assembly process. However, when manually supplying the semiconductor light emitting diodes, the semiconductor light emitting diodes may not be simultaneously supplied. Accordingly, a longer time is required to supply the semiconductor light emitting diodes, and there is a limitation in uniformly supplying the semiconductor light emitting didoes for each assembly line. In addition, as the semiconductor light emitting devices are excessively supplied (in amount or height), some semiconductor light emitting diodes may be damaged. Accordingly, there is required the improvement in the supplying method.

DISCLOSURE

Technical Problem

The present disclosure is to provide an apparatus for supplying a semiconductor light emitting diode, capable of automatically supplying a semiconductor light emitting diode in a fluid. In particular, the present disclosure is to uniformly supply semiconductor light emitting diodes in a fluid at a higher speed.

Technical Solution

According to an embodiment of the present disclosure, an apparatus for supplying a semiconductor light emitting diode, in which semiconductor light emitting diodes are supplied in a fluid chamber to perform a self-assembly process, includes a tray disposed in the fluid chamber, a transfer unit including a magnet and a magnet receiving part, which receives the magnet, to transfer the semiconductor light emitting diodes using magnetic force, a supply unit disposed at an upper portion of the tray to supply the transferred semiconductor light emitting diodes to the tray, and a controller configured to control driving of the tray, the transfer unit, and the supply unit. The controller adjusts a position of the magnet received in the magnet receiving part, such that the semiconductor light emitting diodes are adsorbed on one surface of the magnet receiving part or the adsorbed semiconductor light emitting diode are separated from the one surface of the magnet receiving part.

According to the present embodiment, the magnet receiving part is formed to extend in one direction, and the controller moves the magnet in an extension direction of the magnet receiving part.

According to the present embodiment, the controller brings the magnet into the one surface of the magnet receiving part, such that the semiconductor light emitting diodes are adsorbed on the one surface of the magnet receiving part.

According to the present embodiment, the supply unit includes a housing which includes a first opening part allowing the transfer unit to enter or exit, and a second opening part facing the first opening part and disposed to be adjacent to the tray.

According to the present embodiment, the housing extends in a direction in which the transfer unit enters or exits, and has a width narrowed toward the second opening part from a position in an extension direction of the housing.

According to the present embodiment, the controller supplies the semiconductor light emitting diode to the tray by separating the adsorbed semiconductor light emitting diodes from the one surface of the magnet receiving part while moving the transfer unit and the supply unit along a path, after positioning the transfer unit in the housing, in which the semiconductor light emitting diodes are adsorbed on the one surface of the transfer unit.

According to the present embodiment, the controller further moves the magnet in a direction away from the one surface of the magnet receiving part, while moving the transfer unit and the supply unit.

According to the present embodiment, the supply unit includes a plurality of housings, and the plurality of housings are arranged in a row in any one direction of an extension direction of the tray.

According to the present embodiment, the transfer unit includes a plurality of magnets and the magnet receiving parts.

According to an embodiment of the present disclosure, a method for supplying a semiconductor light emitting diode, especially, a method for supplying semiconductor light emitting diodes in a fluid chamber to perform a self-assembly process, includes (a) adsorbing the semiconductor light emitting diodes on one surface of a magnet receiving part, in which a magnet is received, using magnetic force, (b) moving the magnet receiving part having the adsorbed semiconductor light emitting diodes in a housing provided in the chamber, and (c) supplying the semiconductor light emitting diodes to a tray provided under the housing, while moving the magnet receiving part and the housing through a path.

According to the present embodiment, in the step (a), the magnet makes contact with the one surface of the magnet receiving part such that the semiconductor light emitting diodes are adsorbed on the one surface of the magnet receiving part.

According to the present embodiment, in the step (c), the magnet received in the magnet receiving part is moved in a direction away from the one surface of the magnet receiving part, while the magnet receiving part and the housing are moving in a state of maintaining a distance to the tray.

According to the present embodiment, in the step (c), the semiconductor light emitting diodes are continuously supplied in any one of an extension direction of the tray.

Advantageous Effects

According to an embodiment of the present disclosure, the semiconductor light emitting diodes may be uniformly supplied to a plurality of assembly lines, and may be prevented from being damaged due to excessive supply of the semiconductor light emitting diodes in a specific site.

In addition, the time to supply the semiconductor light emitting diodes may be reduced by simultaneously supplying the semiconductor light emitting diodes to the plurality of assembly lines.

In addition, since the semiconductor light emitting diodes are supplied through the tray, the semiconductor light emitting diodes may be prevented from being lost in the fluid.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5*a* to 5*e* are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8A to 8E are conceptual views illustrating a process of self-assembling a semiconductor light emitting diode using the self-assembly apparatus of FIG. 6.

FIG. 9 is a conceptual diagram for describing the semiconductor light emitting diode of FIGS. 8*a* to 8*e*.

FIG. 10 is a conceptual view illustrating an apparatus for supplying a semiconductor light emitting diode according to an embodiment of the present disclosure.

FIG. 11 is a conceptual view illustrating a manner of adsorbing a semiconductor light emitting diode on one surface of a magnet receiving part according to an embodiment of the present disclosure.

FIG. 12 is a view illustrating a state in which a transfer unit is received in a housing according to an embodiment of the present disclosure.

FIGS. 13 to 15 are views illustrating a process of supplying a semiconductor light emitting diode to a tray using an apparatus for supplying a semiconductor light emitting diode according to an embodiment of the present disclosure.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs), desktop computers, and the like. However, it will be readily apparent to those skilled in the art that the configuration according to the embodiments described in the present specification may be applied to a device capable of display having even a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode 200 may be a flip chip type light emitting diode.

For this example, the semiconductor light emitting diode 200 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5A, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire ($Al_2O_3$), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire ($Al_2O_3$) board, or use at least one of Si, GaAs, GaP, InP, and $Ga_2O_3$.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 159 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as $SiO_2$, SiNx, SiON, $Al2O_3$, $TiO_2$, $HfO_2$, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Hereinafter, an apparatus for supplying a semiconductor light emitting diode according to an embodiment of the present disclosure will be described with reference to the accompanying drawings.

According to an embodiment of the present disclosure, the apparatus 1000 for supplying semiconductor light emitting diode may automatically supply a semiconductor light emitting diode 1050 in a chamber 'C' containing a fluid in which a self-assembly process is performed.

FIG. 10 is a conceptual view illustrating an apparatus for supplying a semiconductor light emitting diode according to an embodiment of the present disclosure.

The apparatus 1000 for supplying semiconductor light emitting diode according to an embodiment of the present disclosure may include a tray 1100, a transfer unit 1200, a supply unit 1300, and a controller (not illustrated), and may be disposed in the fluid chamber 'C' for use as illustrated in FIG. 10.

The tray 1100 may be disposed in the fluid chamber 'C'. The semiconductor light emitting diode 1050 may be supplied to the tray 1100, and semiconductor light emitting diodes 1050 supplied to the tray 1100 may be seated on a substrate through the self-assembly process thereafter.

The tray 1100 may be formed in various shapes and sizes. For example, the tray 1100 may be formed in a rectangular type extending in a direction of rows and/or columns of the substrate.

The semiconductor light emitting diodes 1050 may be supplied to present positions of the tray 1100. For example, the semiconductor light emitting diodes 1050 may be supplied to the tray 1100 while forming a plurality of lines 'L'. The plurality of lines 'L' may be positioned on the tray 1100 corresponding to an assembly position of the substrate loaded in the chamber 'C'. However, the preset position described above is not limited thereto, but may be varied depending on the shape and size of the tray 1100.

The transfer unit 1200 may include a magnet 1210 and a magnet receiving part 1220, and may transfer the semiconductor light emitting diodes 1050 using magnetic force. In more detail, the transfer unit 1200 may transfer the semiconductor light emitting diodes 1050 by controlling the position of the magnet 1210 received in the magnet receiving part 1220.

The magnet receiving part 1220 may extend in one direction, and may also be formed of a transparent material. Since the magnet receiving part 1220 is formed of a transparent material, the position of the magnet 1210 received in the magnet receiving part 1220 may be checked.

The magnet 1210 may be driven independently from the magnet receiving part 1220, in the state of being received in the magnet receiving part 1220. The magnet 1210 may be driven in the extending direction of the magnet receiving part 1220. The controller, which will be described later, may be involved in driving the magnet 1210. Although the magnet 1210 may be separated from the magnet receiving part 1220, the magnet 1210 may be received in the magnet receiving part 1220 while the semiconductor light emitting diode 1050 is being supplied.

The supply unit 1300 may supply the semiconductor light emitting diode 1050, which is transferred by the transfer unit 1200, to the tray 1100. To this end, the supply unit 1300 may be disposed on the tray 1100 in the fluid chamber 'C'.

The supply unit 1300 may include a housing 1310 having opposite ends opened, and the housing 1310 may be disposed on an upper portion of the tray 1100.

The housing 1310 may include a first opening part 1311 through which the transfer unit 1200 enters and exits, and a second opening part 1312 facing the first opening part 1311 and disposed to be adjacent to the tray 1100.

In addition, the housing 1310 may extend in a direction (an up and down direction based on the drawing) in which the transfer unit 1200 enters, and may be formed to have a width decreasing toward the second opening part 1312 from any position in the extension direction.

In other words, the transfer unit 1200 may be received in the housing 1310 through the first opening part 1311, and the semiconductor light emitting diodes 1050 transferred by the transfer unit 1200 may be supplied to the tray 1100 through the second opening part 1312.

In this case, the semiconductor light emitting diodes 1050 may be accurately supplied to a preset position of the tray 1100 due to a structure of the housing 1310, specifically, a structure in which the width is narrowed toward the second opening part 1312.

The controller may control driving of the tray 110, the transfer unit 1200, and the supply unit 1300. Meanwhile, although not illustrated in the drawings, the tray 110, the transfer unit 120, and the supply unit 1300 may include separate component to drive them, based on the control command of the controller.

Hereinafter, a method of supplying the semiconductor light emitting diode 1050 to the tray 1100 in the chamber 'C' using the apparatus 1000 for supplying semiconductor light emitting diode will be described.

First, a step of adsorbing the semiconductor light emitting diodes 1050 onto one surface 1220' of the magnet receiving part, in which the magnet 1210 is received, using magnetic force may be performed. The step may be a step for transferring the semiconductor light emitting diodes 1050 inward from the outside of the chamber 'C'.

The transfer unit 1200 may transfer the semiconductor light emitting diodes 1050 inward from the outside of the chamber 'C' using magnetic force. The magnetic force may be formed on the one surface 1220' of the magnet receiving part depending on the position of the magnet 1210, and the position of the magnet 1210 may be adjusted by the controller.

FIG. 11 is a conceptual view illustrating a manner of adsorbing a semiconductor light emitting diode on one surface of a magnet receiving part according to an embodiment of the present disclosure.

Referring to FIG. 11, the transfer unit 1200 may transfer the semiconductor light emitting diodes 1050 received in a bottle 'B' provided outside the chamber 'C'.

The magnet 1210 may move downward in the extension direction of the magnet receiving part 1220 and be positioned to be adjacent to the one surface 1220' of the magnet receiving part to form magnetic force on the one surface 1220' of the magnet receiving part. Preferably, the magnet 1210 may make close contact with the one surface 1220'.

Since the magnet 1210 is positioned in the magnet receiving part 1220 as described above, the magnetic force may be formed on the one surface 1220' of the magnet receiving part, which is adjacent to the magnet 1210. Accordingly, the semiconductor light emitting diodes 1050 may be adsorbed on the one surface 1220' of the magnet receiving part.

Meanwhile, to the contrast, as the position of the magnet 1210 is adjusted to be away from the one surface 1220'of the magnet receiving part, the semiconductor light emitting diodes 1050 adsorbed on the one surface 1220' of the magnet receiving part may be separated from the one surface 1220'.

Next, a step of moving the transfer unit 1200 or the magnet receiving part 1220 into the housing 1310 provided in the chamber 'C' in the state in which the semiconductor light emitting diodes 1050 are adsorbed may be performed.

FIG. 12 is a view illustrating a state in which a transfer unit is received in a housing according to an embodiment of the present disclosure.

The transfer unit 1200 may be positioned in the housing 1310 through the first opening part 1311 in the state in which the semiconductor light emitting diode 1050 is adsorbed. The transfer unit 1200 may move downward to a predetermined position toward the second opening part 1312 in the housing 1310. In this case, the magnet 1210 may be maintained in a state adjacent to or in contact with one surface 1220' of the magnet accommodating portion.

Next, a step of supplying the semiconductor light emitting diodes 1050 to the tray 1100 while moving the transfer unit 1200 and the supply unit 1300 through a predetermined path may be performed. In this case, the transfer unit 1200 and the supply unit 1300 may refer to the magnet receiving part 1220, in which the magnet 1210 is received, and the housing 1310, respectively.

In the step, the transfer unit 1200 and the supply unit 1300 may move through a horizontal path, while maintaining a vertical interval with respect to the tray 1100. In other words, the predetermined path may be any path on a horizontal plane overlapped with the tray 1100, for example, may be any path for supplying the semiconductor light emitting diodes 1050 to the plurality of lines 'L'.

In the step, the magnet 1210 received in the magnet receiving part 1220 may be moved together with the horizontal movement. In detail, the magnet 1210 may be moved away from the one surface 1220' of the magnet receiving part. Accordingly, the semiconductor light emitting diodes 1050 adsorbed on the one surface 1220' of the magnet receiving part may be separated from the one surface 1220' of the magnet receiving part and supplied to the tray 1100.

In the step, the transfer unit 1200 and the supply unit 1300 may move at the same speed, until the semiconductor light emitting diodes 1050 are completely supplied to the tray 1100, and the magnet 1210 may also move at the same speed. In addition, the movement may be made continuously. Accordingly, the semiconductor light emitting diodes 1050 may be uniformly supplied to the preset positions of the tray 1100 and may be continuously supplied.

Meanwhile, to uniformly supply the semiconductor light emitting diodes 1050 to the tray 1100, there may be further required a component to monitor a supplying state of the semiconductor light emitting diode, for example, an amount and a supply height of the semiconductor light emitting diodes 1050 supplied to a specific site.

In addition, in the process of supplying the semiconductor light emitting diodes 1050 to the tray 1100, a process as illustrated in FIG. 11 may be repeated at least two times. To the contrast, the semiconductor light emitting diodes 1050 remaining after the supplying of the semiconductor light emitting diodes 1050 to the tray 1100 has been finished, may be recovered to the bottle 'B' provided outside the chamber 'C' in the manner illustrated in FIG. 11.

FIGS. 13 to 15 are views illustrating a process of supplying a semiconductor light emitting diode to a tray using an apparatus for supplying the semiconductor light emitting diode according to an embodiment of the present disclosure, as described above.

Referring to FIGS. 13 to 15, the magnet 1210 and the magnet receiving part 1220 constituting the transfer unit 1200, and the housing 1310 constituting the supply unit 1300 may be provided in plural. In addition, the magnet receiving part 1220, in which the magnet 1210 is received, may be received in each of a plurality of housings 1310.

The plurality of housings 1310 may be arranged in a row in any one of the extension directions of the tray 1100. According to an embodiment, the plurality of housings 1310 may be arranged in a row in a direction of a longer side of the extending direction of the tray 1100 as illustrated in the drawing. Accordingly, a moving path may be shorted in a process of supplying the semiconductor light emitting diode 1050, the semiconductor light emitting diodes 1050 may be simultaneously supplied to the plurality of lines 'L', and the time to supply the semiconductor light emitting diode 1050 may be shorted.

As described above, according to an embodiment of the present disclosure, the apparatus 1000 for supplying semiconductor light emitting diode may uniformly supply the semiconductor light emitting diodes 1050 to the plurality of assembly lines 'L', and may prevent the semiconductor light emitting diodes 1050 from being damaged as the semiconductor light emitting diodes are excessively supplied to the specific site.

In addition, as the semiconductor light emitting diodes 1050 are simultaneously supplied to the plurality of assembly lines 'L', the time to supply the semiconductor light emitting diodes 1050 may be reduced. In addition, since the semiconductor light emitting diodes 1050 are supplied to the tray 1100, the semiconductor light emitting diodes 1050 may be prevented from being lost in fluid The present disclosure is not limited to the above-described configuration and method of the embodiments, but the embodiments may be configured by selectively combining all or part of the embodiments, such that various modifications may be performed.

The invention claimed is:

1. An apparatus for supplying a semiconductor light emitting diode among semiconductor light emitting diodes that are supplied in a fluid chamber to perform a self-assembly process for the semiconductor light emitting diodes, the apparatus comprising:
 a tray disposed in the fluid chamber;
 a transferor including a magnet and a magnet receiver, which receives the magnet, to transfer the semiconductor light emitting diodes using magnetic force;
 a supplier disposed at an upper portion of the tray to supply the semiconductor light emitting diodes to the tray; and
 a controller configured to control driving of the tray, the transferor, and the supplier,
 wherein the controller is configured to:
  adjust a position of the magnet received in the magnet receiver, so that the semiconductor light emitting diodes are adsorbed on one surface of the magnet receiver or the adsorbed semiconductor light emitting diodes are separated from the one surface of the magnet receiver,
 wherein the magnet is driven independently from the magnet receiver in a state of being received in the magnet receiver, and
 wherein the magnet is driven in an extending direction of the magnet receiver.

2. The apparatus of claim 1, wherein the magnet receiver is formed to extend in one direction, and
 wherein the controller moves the magnet in an extension direction of the magnet receiver.

3. The apparatus of claim 1, wherein the controller is configured to bring the magnet into the one surface of the magnet receiver, so that the semiconductor light emitting diodes are adsorbed on the one surface of the magnet receiver.

4. The apparatus of claim 1, wherein the supplier includes:
 a housing which includes a first opening allowing the transferor to enter or exit, and a second opening facing the first opening and disposed to be adjacent to the tray.

5. The apparatus of claim 4, wherein the housing extends in a direction in which the transferor enters or exits, and has a width narrowed toward the second opening from a position in an extension direction of the housing.

6. The apparatus of claim 4, wherein the controller is configured to:
- supply the semiconductor light emitting diodes to the tray by separating the adsorbed semiconductor light emitting diodes from the one surface of the magnet receiver while moving the transferor and the supplier along a path, after positioning the transferor in the housing, in which the semiconductor light emitting diodes are adsorbed on the one surface of the transferor.

7. The apparatus of claim 6, wherein the controller is configured to:
- further move the magnet in a direction away from the one surface of the magnet receiver, while moving the transferor and the supplier.

8. The apparatus of claim 1, wherein the supplier includes:
a plurality of housings, and
wherein the plurality of housings are arranged in a row in any one direction of an extension direction of the tray.

9. The apparatus of claim 1, wherein the transferor includes a plurality of magnets and a plurality of magnet receivers.

\* \* \* \* \*